(12) United States Patent
Melanson

(10) Patent No.: US 6,414,614 B1
(45) Date of Patent: Jul. 2, 2002

(54) POWER OUTPUT STAGE COMPENSATION FOR DIGITAL OUTPUT AMPLIFIERS

(75) Inventor: John Laurence Melanson, Boulder, CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/510,035

(22) Filed: Feb. 22, 2000

Related U.S. Application Data
(60) Provisional application No. 60/121,205, filed on Feb. 23, 1999.

(51) Int. Cl.[7] .................................................. H03M 3/00
(52) U.S. Cl. .......................... 341/143; 341/126; 330/10
(58) Field of Search .................................. 341/143, 126, 341/144, 145, 155, 156, 131, 152, 117, 118; 330/207 A, 10

(56) References Cited

U.S. PATENT DOCUMENTS

| | | | |
|---|---|---|---|
| 5,548,286 A | | 8/1996 | Craven |
| 5,708,433 A | | 1/1998 | Craven |
| 5,777,512 A | * | 7/1998 | Tripathi et al. ......... 330/207 A |
| 5,784,017 A | * | 7/1998 | Craven ..................... 341/126 |
| 6,232,899 B1 | * | 5/2001 | Craven ..................... 341/126 |
| 6,297,692 B1 | * | 10/2001 | Nielsen ..................... 330/10 |

* cited by examiner

Primary Examiner—Brian Young
Assistant Examiner—John Nguyen
(74) Attorney, Agent, or Firm—Jennifer L. Bales, Esq.; Dan A. Shifrin, Esq.

(57) ABSTRACT

Circuitry is provided to compensate for distortion introduced into the output signal of a delta sigma digital to analog converter (DAC) by the power output stage of the amplifier. Such distortion is not consistent for a given output data value or short series of data values, but must be either measured and corrected in real time or must be corrected in real time based upon a sophisticated model of the system that predicts the distortion. Correction is applied to one or more feedback loops in the delta sigma converter. Distortion caused by fluctuations in the power supply voltage may also be modeled and corrected in real time.

26 Claims, 12 Drawing Sheets

POWER OUTPUT STAGE COMPENSATION FOR DIGITAL OUTPUT AMPLIFIERS

BACKGROUND OF THE INVENTION

This application claims the benefit of U.S. Provisional Application No. 60/121,205, filed Feb. 23, 1999.

FIELD OF THE INVENTION

The present invention relates to power output stage compensation for digital output amplifiers.

DESCRIPTION OF THE PRIOR ART

A typical circuit for the creation of a digital data stream to drive a power output stage is a delta sigma modulator, with or without a pulse width modulator conversion stage at its output, feeding a digital output amplifier, which drives a speaker. FIG. 1 (prior art) is a block diagram of a digital to analog converter (DAC) 100 comprising a delta sigma modulator 104 feeding a power output stage 114 into a speaker 120. In the circuit shown in FIG. 1, a pulse width modulator (PWM) 108 converts the format of the data 106 from delta sigma modulator 104. PWM 108 generates control signals 110, 112 which feed into class D power output stage 114. Analog power output signals 116, 118 from class D output 114 drive speaker 120. It is known in the art to measure the voltage of the driver output, and to use that value 122 as feedback to the delta sigma modulator 104. This can approximately correct the loop, but some errors remain. If the distortion is due to the rise time of data pulses being smaller than the fall time, not only the area under the waveform curve is affected, but also the time delay (or higher moments) of the waveform.

The conversion to PWM is a desirable, but not necessary step. The use of PWM is preferred in many power applications, but the same comments will also apply to the direct conversion to analog of a 1 bit or multi bit delta sigma data stream.

U.S. patent application Ser. No. 09/163,235 by the present inventor (incorporated herein by reference) describes correction of systematic nonlinear output distortion that occurs in delta sigma digital to analog converters (or DACs). Feedback here is compensated feedback, as the feedback value includes the "normal" feedback term as well as the correction. U.S. patent application Ser. No. 09/457,014 by the present inventor (incorporated herein by reference) describes compensating delta sigma converters by correlating an output signal with the same signal passed through a selected nonlinear function, and correcting the output based upon the correlation.

FIG. 2 (prior art) is a block diagram of a second order one bit delta sigma converter 104 which includes separate feedback correction 242, 244 to each of the accumulators 40, 44, in order to compensate for errors relating to both the area of output wave forms and delay in the waveforms. A second order delta sigma converter 104 is shown and described for simplicity, but those skilled in the art will appreciate that the same considerations apply to higher order convertors as well. Quantizer 50 is typically a multi bit quantizer in a system where it will be combined with a PWM stage. In the non-compensated case, 242 and 244 will implement unity gain functions. In second order delta sigma quantizer 104, feedback to each accumulator is compensated for nonlinear variations in output data. If there are time effects, such as pattern generation or slew rate issues, correction block 242 and correction block 244 must implement non-trivially different functions, to account for first and second order variations. For example, one loop may be corrected, but not the other. Or, each loop may be corrected in a different manner. A non-trivial difference is where one feedback function is not a simple linear function of the other. Obviously higher moment errors can be corrected in higher order delta sigma converters with more feedback compensation. There exist many structures for the implementation of such delta sigma modulators. "Delta-Sigma Data Converters" by Norsworthy et al., IEEE Press, 1997, is a good review of the state of the art.

The inventions taught in U.S. patent application Ser. No. 09/163,235 relate specifically to correcting systematic output errors that are predictable for a given data value or series of data values. In order to compensate for unpredictable output distortion, compensation blocks 242, 244 have to be modified in real time to properly correct for the distortion.

It is well understood that a weak link in the creation of a digital output amplifier such as class D output 114 is the imperfections of the output switches. These switches have non-zero impedance, and have rise and fall times that are significant. In addition, it is necessary to have a small dead time between the high side switch and the low side switch in order to guarantee reliable operation. Simultaneous closure of both switches will damage the system, because of the extreme current flow. FIG. 3 (prior art) is a block diagram of a conventional class D power output stage 114. Inputs 110, 112 feed into dead time controls 302, 322, which prevent high side driver 304 from operating at the same time as low side driver 306 and prevent high side driver 324 from operating at the same time as low side driver 326. In typical operating mode, points A and C are driven to opposite extremes, and switch 310 will be operated during the same time as switch 334, while 314 will be operated during the same time as 330. If the duty cycle is 50%, i.e. the two times are identical, the effective voltage delivered to the load (connected between 166 and 118) is 0. As the duty cycle changes, the effective output voltage can be driven positive or negative.

Low side drivers 306 and 326 provide the current necessary to charge and discharge the gates of 314 and 334. Similarly, high side drivers 310 and 330 provide drive for switching FETs 310 and 330. The diode-capacitor network of 308 and 312 provides a bootstrapped power source for 304. Similarly, 328 and 332 provide a power source for 324.

The high and low drivers may have significant delays and can only charge or discharge the FET gates at a finite rate. Because of these real world limitations, the dead time control must guarantee that there is no cross-conduction. These effects give rise to the distortion that must be corrected.

FIG. 4 (prior art) is a timing diagram of signals from class D output 114. In the example of FIG. 4, Signal A is high one third of the time and signal C is high two thirds of the time, resulting in filter signal B at one third level and D at two thirds level. In this case, signal A and C together average 50% on and 50% off. In some cases, it may be of value to use a modulation scheme in which the A and C signals are not mirror images of each other.

One prior art solution to the sensitivity of such a system to imperfections in the output stage switches is to carefully control the output waveforms using circuits to control the drive to the switch devices. This technique can produce acceptable results, but requires expensive analog circuitry.

A need remains in the art for apparatus and methods to correct for output distortion that is not predictable for a given value or short series of values, by either measuring the distortion and correcting it in real time or by building a model of the distortion for the system and correcting the distortion according to the model.

SUMMARY OF THE INVENTION

An object of the present invention is to compensate for distortion introduced into the output signal of a delta sigma digital to analog converter (DAC) by the power output stage of the amplifier. Such distortion is not consistent for a given output data value or short series of data values, but must be either measured and corrected in real time or must be corrected in real time based upon a sophisticated model of the system that predicts the distortion.

Apparatus for compensating for output distortion in a class D power output stage driven by a delta sigma modulator of at least second order includes means for determining distortion within the class D power output stage, means for generating a distortion signal based upon the distortion within the class D power output stage, and means for modifying at least two feedback signals in the delta sigma modulator, in non-trivially different manners, in real time, responsive to the distortion signal.

The means for determining distortion measures a signal in the class D power output stage in real time, such as output voltage or current. The measurement might take place during dead time, and the waveform might be monitored. In this case, the distortion signal would include two signals representing two moments of the waveform. Preferably The means for determining distortion might also compare two output signals of the class D power output stage. Signal timing between the two signals may also be measured.

Apparatus for compensating for output distortion in a class D power output stage driven by a delta sigma modulator could instead include means for modelling distortion within the class D power output stage, means for generating a distortion signal based upon the model, and means for modifying a feedback signal in the delta sigma modulator in real time, responsive to the distortion signal.

The means for modelling could numerically compute expected distortion values based upon circuit elements in the output stage. Or, the means for modelling could includes means for monitoring two output signals of the class D power output stage, means for computing distortion in the class D power output stage for various signal patterns based on the two monitored output signals, and means for estimating distortion in the class D power output stage for a given signal pattern out of the delta sigma modulator.

The means for modelling distortion could also learn. Then the modelling means would include means for monitoring the signal pattern out of the delta sigma modulator in real time, and means for utilizing the modelling means to estimate the distortion for the current signal pattern out of the delta sigma modulator.

Two feedback signals in the delta sigma modulator could modified in response to the distortion signal, each feedback signal being modified in a non-trivially different manner from the other feedback signal. The modelling means could be slowly modified in real time based upon the two output signals of the class D power output stage.

The means for modelling could include means for correlating noise from the output stage with noise into the output stage passed through a nonlinear element.

The apparatus could include a pulse wave modulator (PWM) between the delta sigma modulator and the class D power output stage, where the PWM is fed by the delta sigma modulator and drives the class D power output stage. The apparatus could also include means for monitoring power supply voltage, so the distortion signal is further based upon the power supply voltage.

Apparatus for compensating for output distortion in a class D power output stage driven by a delta sigma modulator, could include means for modelling distortion within the class D power output stage, means for generating a distortion signal based upon the model, means for modifying a feedback signal in the delta sigma modulator in real time, responsive to the distortion signal, and means for updating the model based upon an output signal of the class D power output stage.

The means for updating preferably measures more than one moment of the output signal of the class D power output stage, and the means for modelling preferably generates two distortion signals, to modify two feedback signals in the delta sigma modulator in non-trivially different manners.

The means for updating could update the modelling means once on apparatus power up, or continuously.

The means for modelling could further comprise means for monitoring two output signals of the class D power output stage, means for computing distortion in the class D power output stage for various signal patterns based on the two monitored output signals, and means for estimating distortion in the class D power output stage for a given signal pattern out of the delta sigma modulator.

Apparatus for compensating for output distortion in a class D power output stage driven by a delta sigma modulator could include means for determining distortion within the class D power output stage by measuring two signals in the class D power output stage, and measuring signal timing between the two signals, in real time, means for generating a distortion signal based upon the determined distortion, and means for modifying a feedback signal in the delta sigma modulator in real time, responsive to the distortion signal.

The means for measuring could measure two output voltage signals during dead time. Or, the means for measuring could measure two output current signals during dead time.

DETAILED DESCRIPTION OF THE PREFERRED EMBODIMENTS

Figure 4:
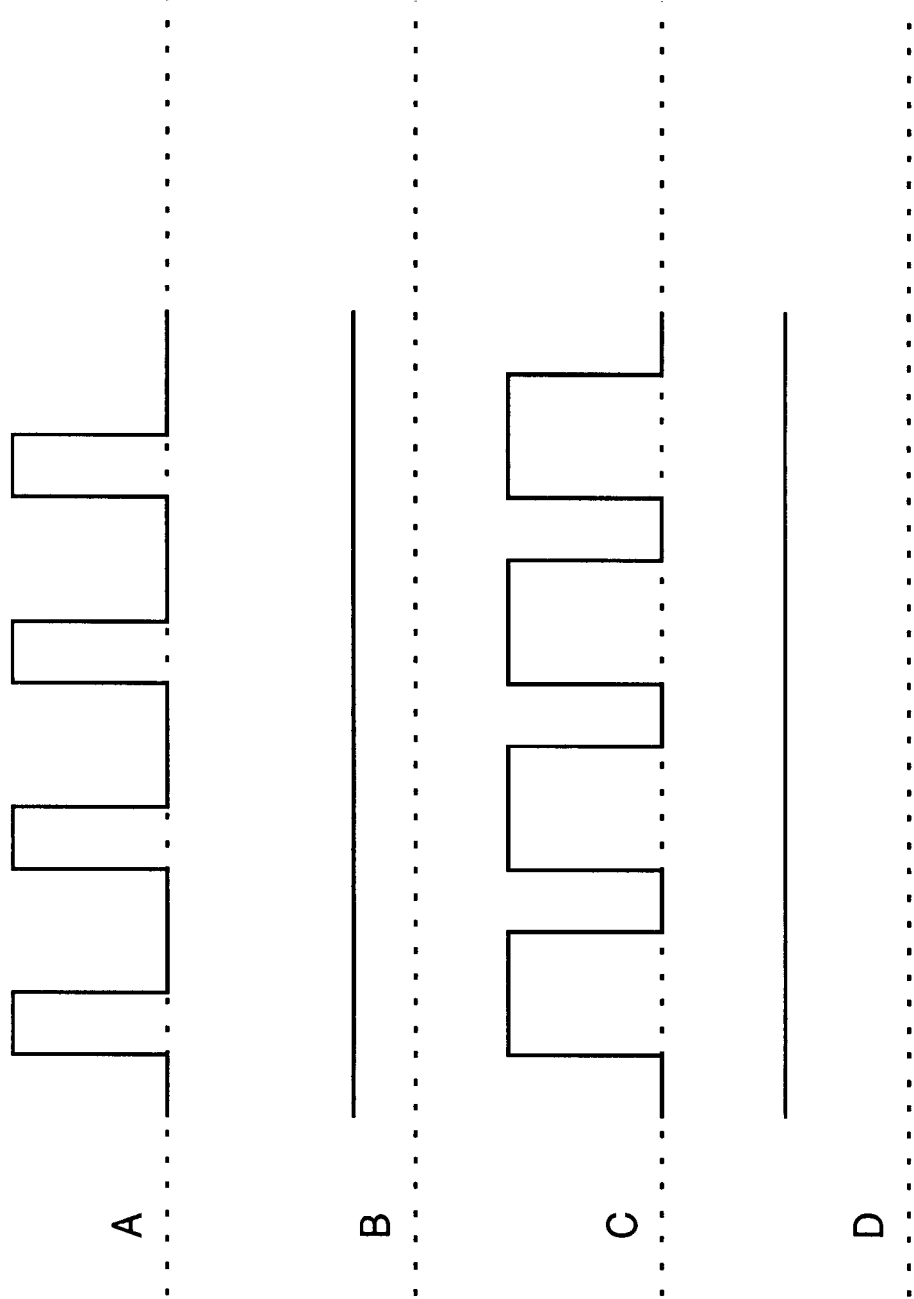
FIG. 4 (prior art) is a timing diagram of signals from the block diagram of FIG. 3.
Figure 5:
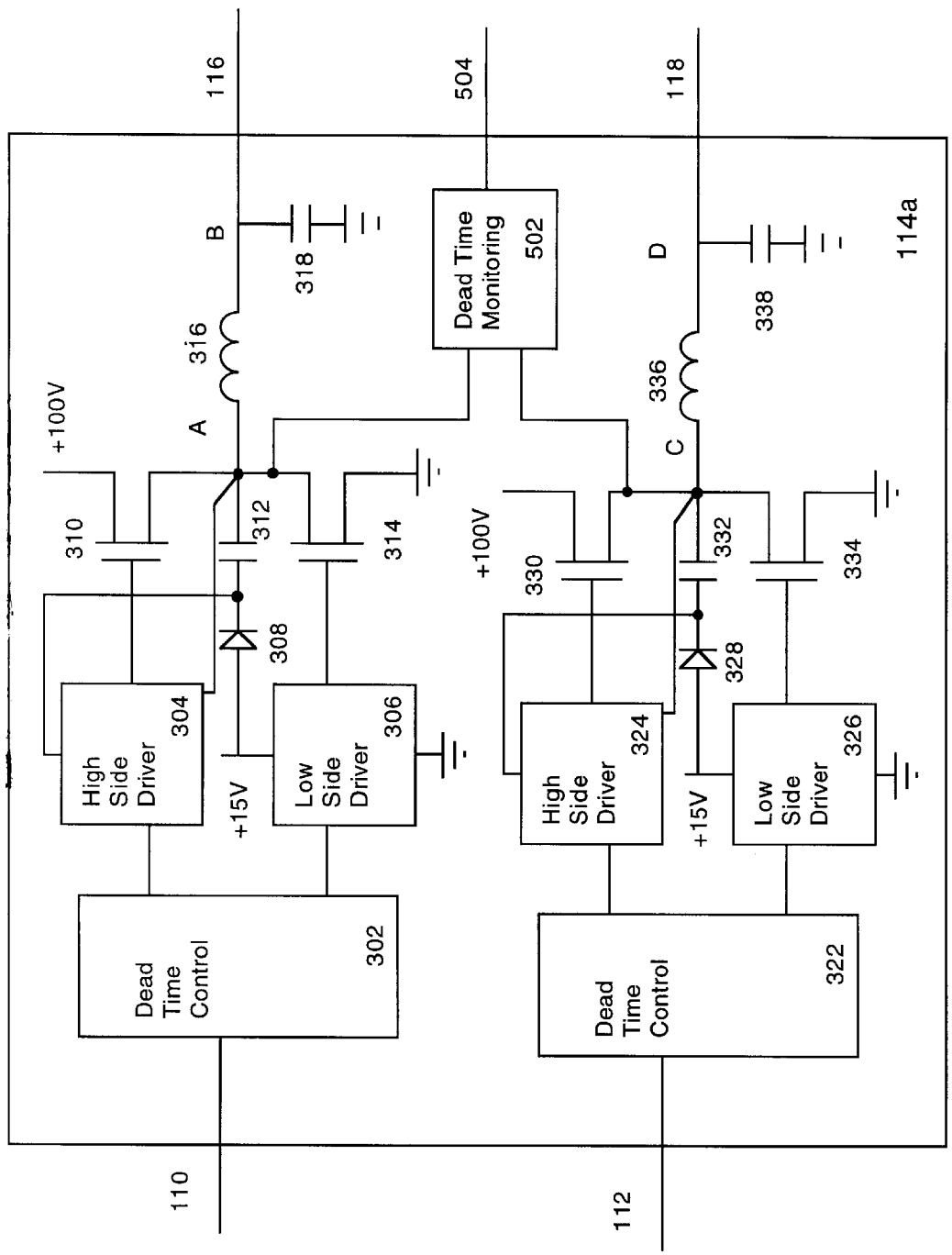
FIG. 5 is a block diagram of circuitry added to the class D power output stage of FIG. 3 according to the present invention for measuring signals for feedback to the delta sigma modulator of FIG. 2.

FIG. 5 is a block diagram of circuitry added to class D power output stage 114*a* for measuring signals for feedback to delta sigma modulator 104. Dead time monitoring block 502 takes digital signals A and C (shown in FIG. 4) and measures the output voltage during the dead time. One measure may be made, such as the average voltage during the dead time, or more sophisticated measures that relate to both the time and voltage. Signal 504 represents the results of that measurement, and is fed back to delta sigma modulator 104*a* as shown in FIG. 6.

Figure 6:
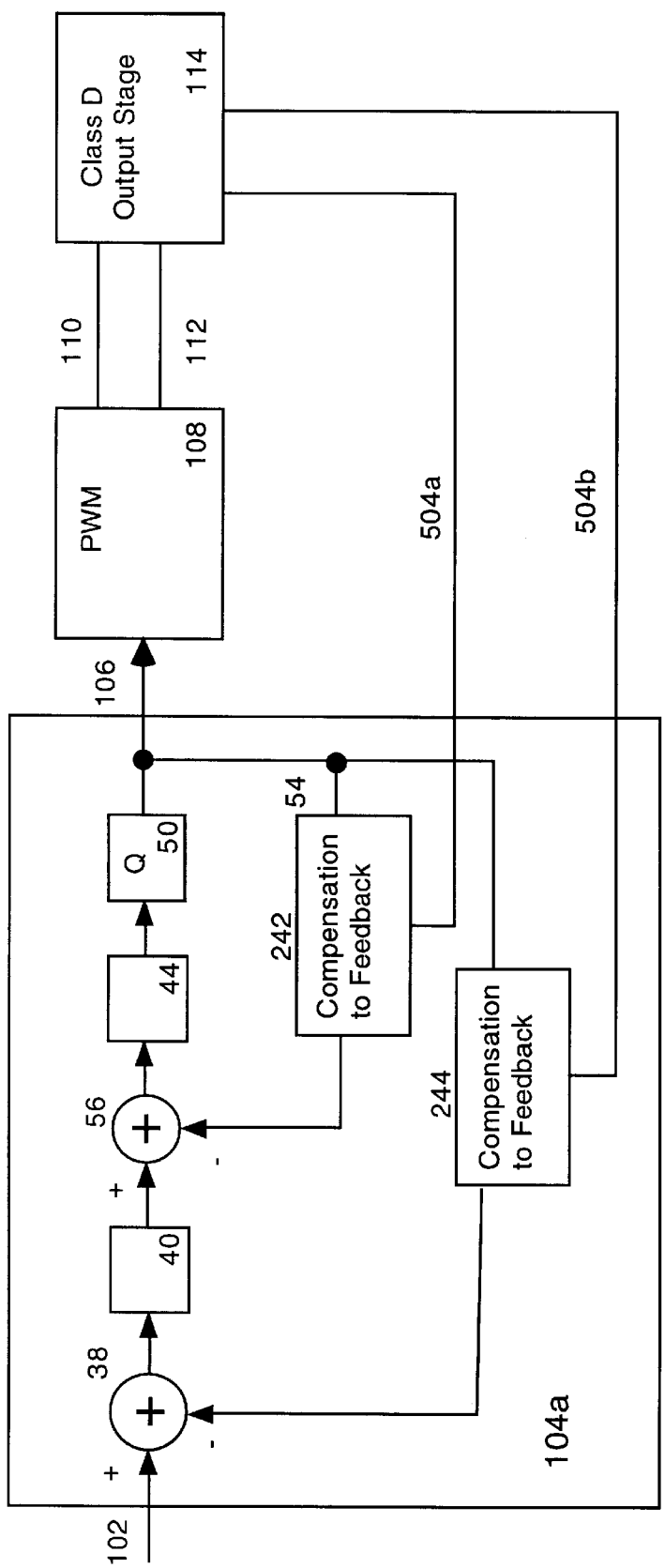
FIG. 6 is a block diagram of a power output stage according to the present invention including a feedback signal from the class D power output stage.

FIG. 6 shows feedback signal(s) 504 from class D power output stage 114*a* to delta sigma modulator 104*a*. In the particular embodiment of FIG. 6, two different feedback correction signals 504*a* and 504*b* are used as inputs to compensation blocks 242, 244. For example, 504*b* might represent the area under a waveform and 504*a* might represent the timing (center of gravity) of the waveform. However it would also be possible to feedback the same signal 504 to both compensation blocks 242, 244. For example, signal 504, representing the area under the curve, could be fed back to both blocks 242 and 244, but block 244 would compensate the feedback directly according to signal 504, while block 242 would use signal 504 as an input to a lookup table, and estimate the waveform timing based on signal 504. It would also be possible to supply signal 504 to only one of the two compensation blocks 242, 244. For example, signal 504 might represent the rise time of the waveform, and it might be used by compensation block 244 to estimate the area under the waveform curve.

Figure 7:
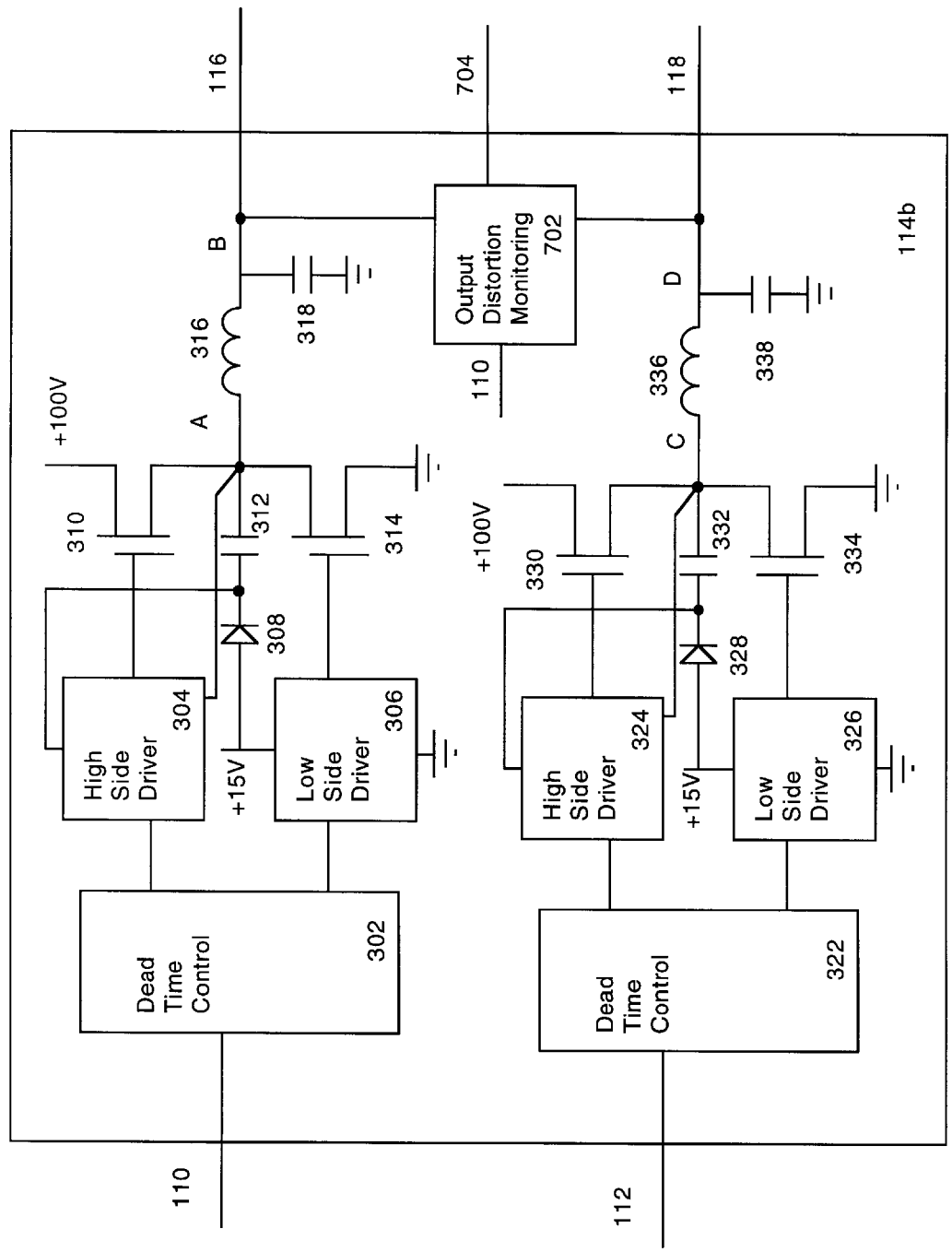
FIG. 7 is a block diagram of circuitry added to the class D power output stage of FIG. 3 according to the present invention for measuring signals for modeling the power output stage.
Figure 8:
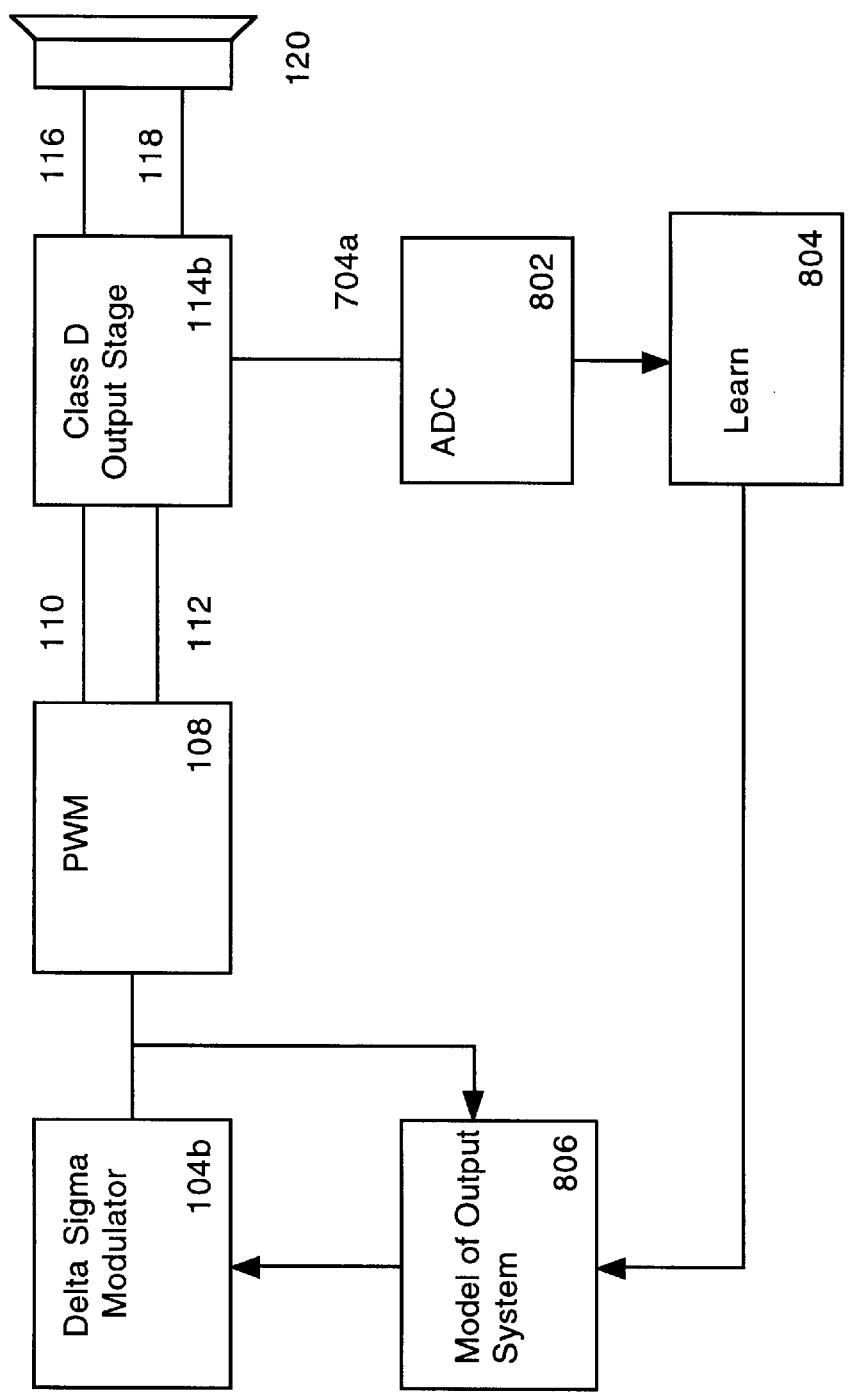
FIG. 8 is a block diagram of circuitry according to the present invention for modeling the power output stage of the DAC of FIG. 3 to provide a correction signal to the delta sigma modulator.
Figure 9:
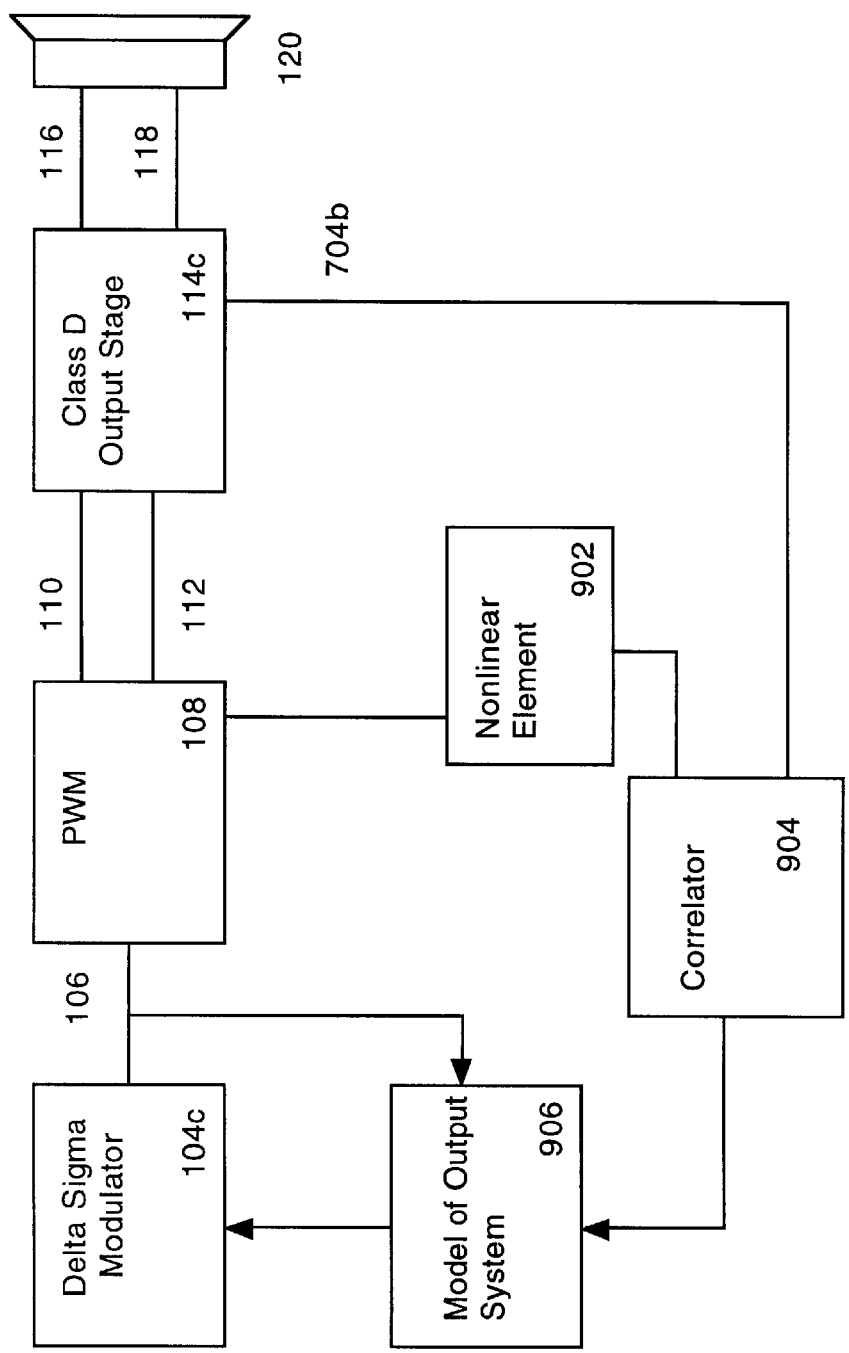
FIG. 9 is a block diagram of a second embodiment of circuitry according to the present invention for modeling the power output stage of the DAC of FIG. 3 to provide a correction signal to the delta sigma modulator.
Figure 12:
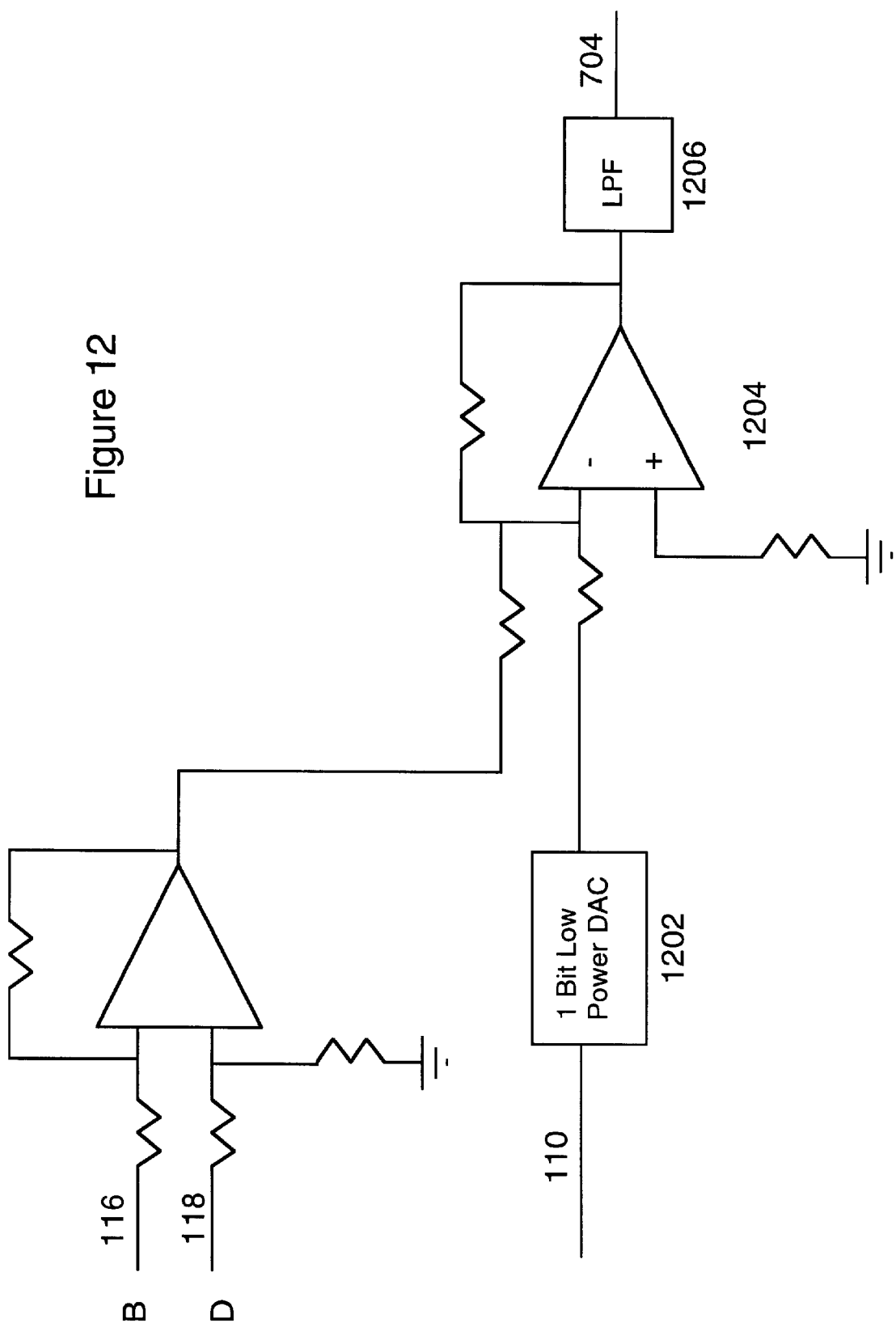
FIG. 12 is a block diagram of an embodiment of an output distortion monitoring block of FIG. 7.

FIG. 7 is a block diagram showing circuitry added to class D power output stage 114*b* for measuring signals for modeling the power output stage. Output distortion monitoring block 702 takes analog signals B and D (shown in FIG. 4) and measures the difference between the output and the ideal signal. Signal 704 represents the output error and is input to modeling circuitry as shown in FIGS. 8 and 9. FIG. 12 shows one embodiment of output distortion monitoring block 702, comprising a perfect one bit DAC 1202, an analog subtraction circuit 1204, and finally an output capable of driving an ADC 1208. The output is a measure of the distortion in the switching circuit. At the low signal power levels required, the one bit DAC can be very near to perfect. The one bit DAC is driven by a delta sigma modulator that matches the time delay of the PWM stage. Low pass filter 1206 removes signals above the audio band, which would not be considered distortion.

Figure 1:
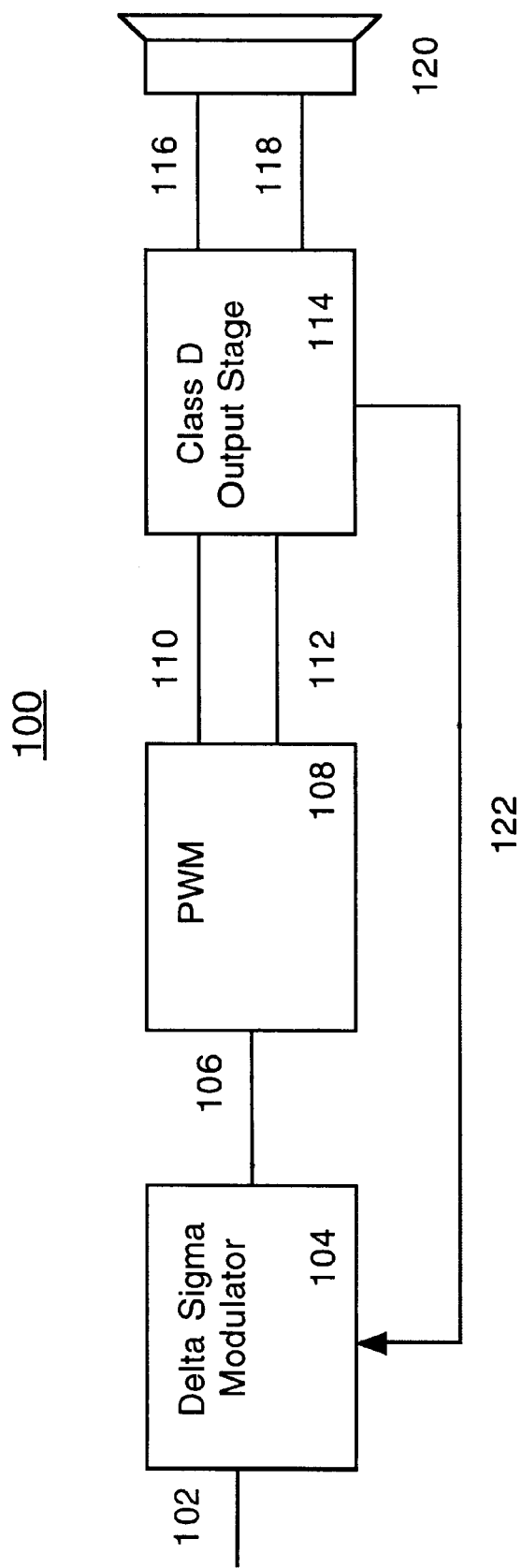
FIG. 1 (prior art) is a block diagram of a second order delta sigma modulator with separate correction of the two feedback paths to compensate for predictable systematic errors in the output path.
Figure 2:
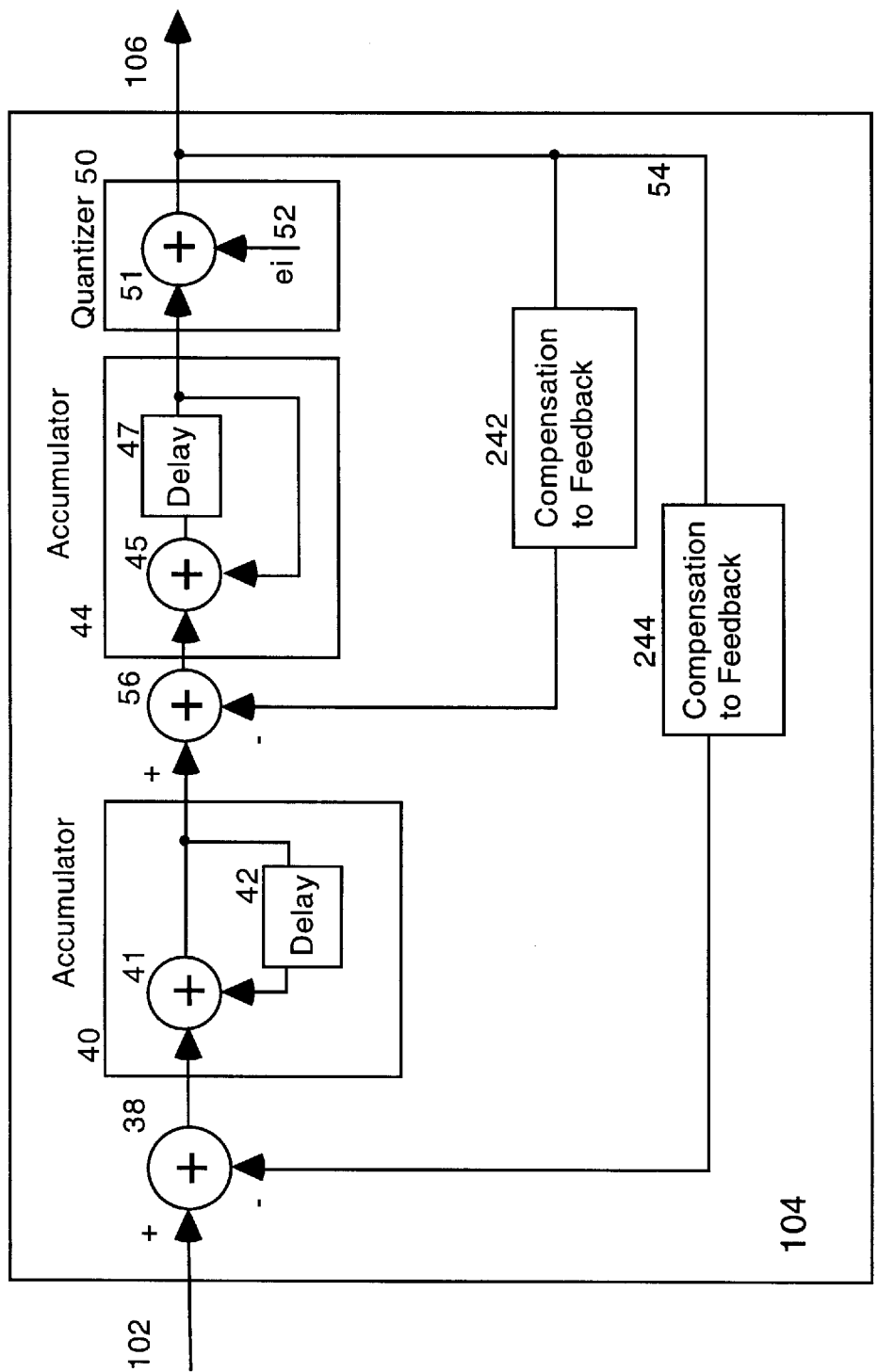
FIG. 2 (prior art) is a block diagram of a digital to analog converter (DAC) comprising a delta sigma modulator feeding a power output stage into a speaker.
Figure 3:
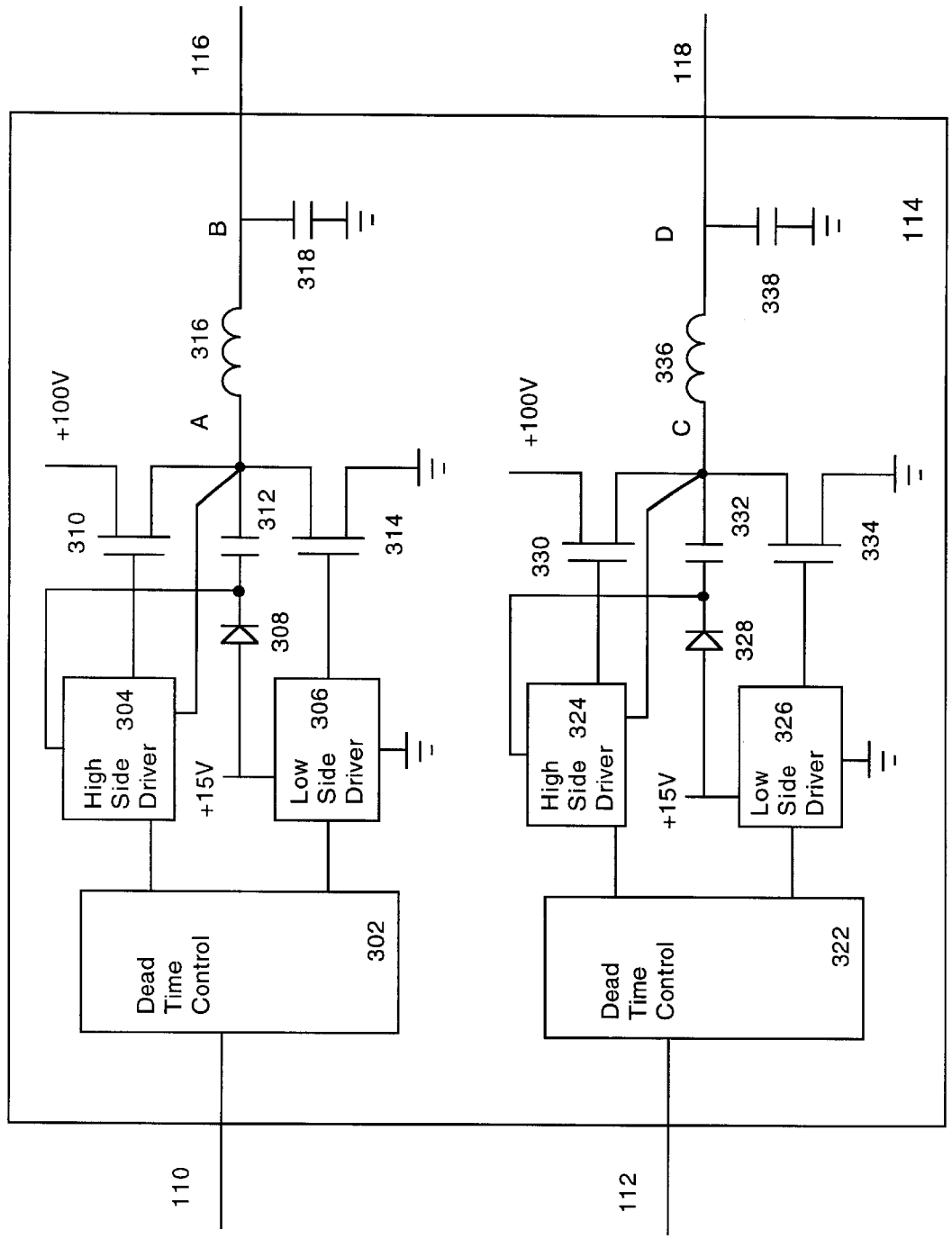
FIG. 3 (prior art) is a block diagram of a class D power output stage.

FIG. 8 is a block diagram of circuitry for modeling the power output stage of the DAC of FIG. 3 to provide a correction signal or signals to delta sigma modulator 104*b*. Signal 704*a* is converted to a digital signal by ADC 802 (preferably a delta sigma ADC). Learn block 804 monitors signals B and D as Class D stage 114*b* operates and determines the characteristics of the voltage waveforms for various signal patterns, and conditions, and modifies model 806. As an example of the type of behavior learned, note that the voltage during the dead time is very dependent on the direction of current through the output filter inductor. Estimation of this current by a model would allow for a good estimation of the waveform during the dead time. This modification of the model may be done in a test mode or on an ongoing basis. Key to this design is that the model update is much slower than real time (i. e. the model is not updated for each data point), while the model is used in real time.

In use, model 806 has as its input signal 106 from delta sigma converter 104*b*. Model 806 computes the expected output voltage of class D output 114*b* for that data point, and provides a correction signal to one or more of the compensation blocks 242, 244 in delta sigma converter 104*a*.

FIG. 9 is a block diagram showing a second embodiment of circuitry according to the present invention for modeling the power output stage of the DAC of FIG. 3 to provide a correction signal to delta sigma modulator 104*c*. This circuitry correlates noise from output stage 114*c* with a noise signal generated by a nonlinear block whose purpose is to isolate the imperfection being measured. This takes place in a test mode, so that a variety of different imperfections in Class D stage 114*c* may be measured, such as different rise and fall times for the switches, different results depending upon whether the current in the speaker is positive or negative, dead time between the high side switch and the low side switch, etc. As an example, 902 could output a signal only during the rise time of one of the output switches. The correlation between the two signals would then be the error associated with that isolated imperfection (in this case rise time error). Correlator 904 feeds this error to model 906, which builds its model to incorporate the error.

In use, model 906 has, as its input, signal 106 from delta sigma converter 104*c*. Model 906 computes the expected output voltage of class D output 114*b* for that data point by adding the errors from the class D stage 114*c* imperfections, and provides a correction signal to one or more of the compensation blocks 242, 244 in delta sigma converter 104*c*.

Figure 10:
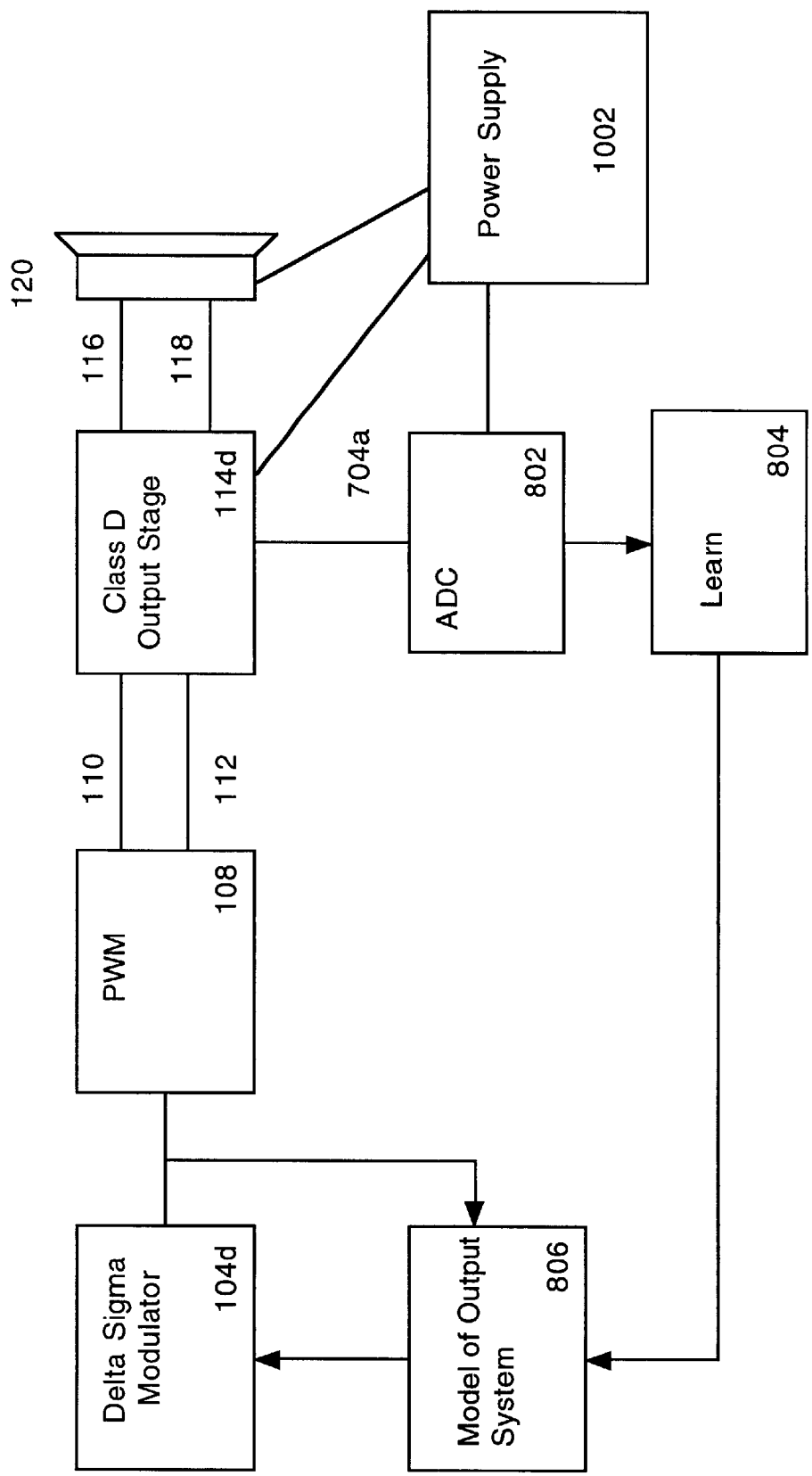
FIG. 10 is a block diagram of a third embodiment of circuitry according to the present invention for modeling the power output stage of the DAC of FIG. 3 and the power supply of the system to provide a correction signal to the delta sigma modulator.

FIG. 10 is a block diagram showing a third embodiment of circuitry according to the present invention for modeling both the power output stage voltage and the power supply voltage to provide a correction signal to delta sigma modulator 104*d*. The model estimates the current being drawn out of the power supply, and also the current line voltage in to the power supply filter cap. A simple model of the power supply current allows for the estimation of the current voltage, which can be used to correct the feedback in the delta sigma modulator.

Figure 11:
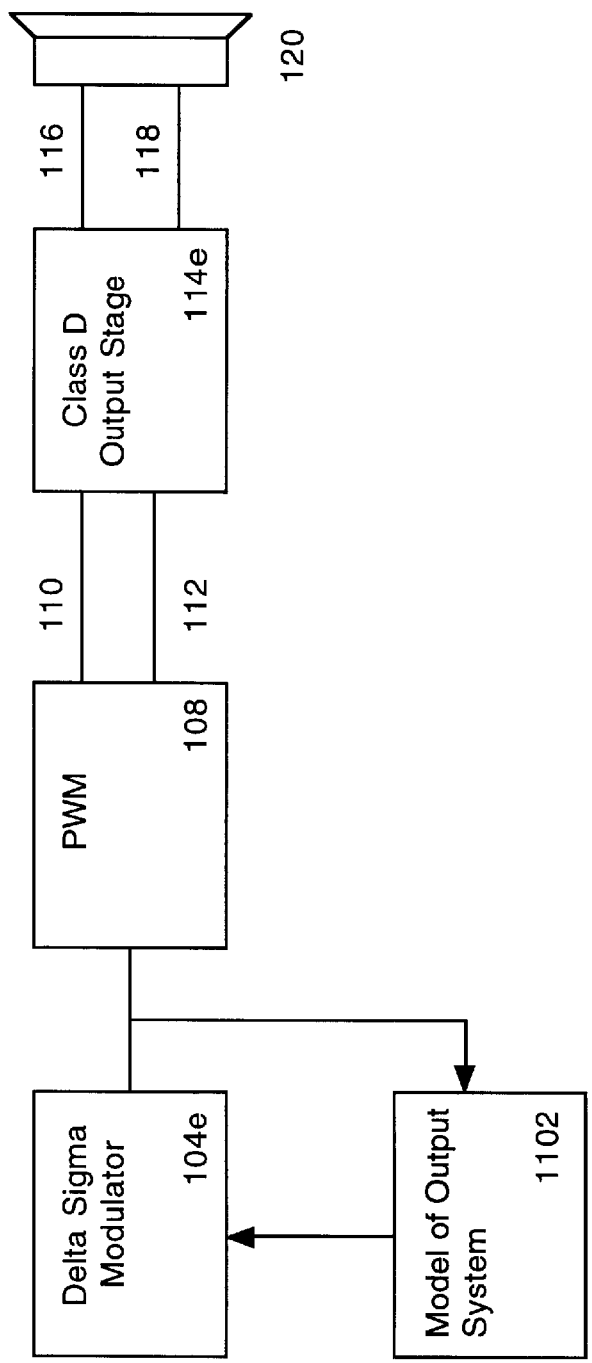
FIG. 11 is a block diagram of a fourth embodiment of circuitry according to the present invention for modeling the power output stage of the DAC of FIG. 3 to provide a correction signal to the delta sigma modulator.

FIG. 11 is a block diagram showing a fourth embodiment of circuitry according to the present invention for modeling the power output stage of the DAC of FIG. 3 to provide a correction signal to delta sigma modulator 104*e*. Unlike the embodiments in FIGS. 8, 9, and 10, model 1102 is not derived from measures of actual system performance, but rather is numerically computed based upon the driver, filters, and speaker elements of the output circuitry. Model 1102 has as its input signal 106 from delta sigma converter 104e. Model 1102 computes an estimate of the voltage waveform on the output of the drivers of class D stage 114e, and provides a correction signal to one or more of the compensation blocks 242, 244 in delta sigma converter 104e. It is here assumed that the model is developed in the laboratory, and that it is very similar between units of the same design.

While the exemplary preferred embodiments of the present invention are described herein with particularity, those skilled in the art will appreciate various changes, additions, and applications other than those specifically mentioned, which are within the spirit and scope of this invention.

Although the discussion is centered around a PWM based power amplifier, one versed in the art would be able to apply the same concepts to any DAC that has errors due to imperfections in the analog circuitry.

What is claimed is:

1. Apparatus for compensating for output distortion in a class D output stage driven by a delta sigma modulator of at least second order, the apparatus comprising:
   means for determining distortion within the class D output stage;
   means for generating a distortion signal based upon the distortion within the class D output stage; and
   means for modifying at least two feedback signals in the delta sigma modulator, in non-trivially different manners, in real time, responsive to the distortion signal.

2. The apparatus of claim 1 wherein the means for determining distortion comprises means for measuring a signal in the class D output stage in real time.

3. The apparatus of claim 2 wherein the means for measuring distortion comprises means for measuring output voltage of the class D output stage during dead time.

4. The apparatus of claim 3, wherein the means for measuring distortion measures the waveform of the output voltage during dead time, and wherein the means for generating a distortion signal generates two signals representing two moments of the waveform.

5. The apparatus of claim 2 wherein the means for measuring distortion comprises means for measuring output current of the class D output stage during dead time.

6. The apparatus of claim 2 wherein the means for measuring distortion comprises means for comparing two output signals of the class D output stage.

7. The apparatus of claim 2 wherein the means for measuring distortion comprises means for measuring signal timing.

8. The apparatus of claim 1 wherein the means for determining distortion comprises means for modelling the distortion in the class D output stage.

9. Apparatus for compensating for output distortion in a class D output stage driven by a delta sigma modulator, the apparatus comprising:
   means for modelling distortion within the class D output stage;
   means for generating a distortion signal based upon the model; and
   means for modifying a feedback signal in the delta sigma modulator in real time, responsive to the distortion signal.

10. The apparatus of claim 9, wherein the means for modelling comprises means for numerically computing expected distortion values based upon circuit elements in the output stage.

11. The apparatus of claim 9, wherein the means for modelling includes:
    means for monitoring two output signals of the class D output stage;
    means for computing distortion in the class D output stage for various signal patterns based on the two monitored output signals; and
    means for estimating distortion in the class D output stage for a given signal pattern out of the delta sigma modulator.

12. The apparatus of claim 9, wherein the means for modelling distortion comprises:
    means for monitoring the signal pattern out of the delta sigma modulator in real time; and
    means for utilizing the modelling means to estimate the distortion for the current signal pattern out of the delta sigma modulator.

13. The apparatus of claim 12 wherein two feedback signals in the delta sigma modulator are modified in response to the distortion signal, and wherein each feedback signal is modified in a non-trivially different manner from the other feedback signal.

14. The apparatus of claim 12, further comprising means for slowly modifying the modelling means in real time based upon the two output signals of the class D output stage.

15. The apparatus of claim 9, wherein the means for modelling includes means for correlating noise from the output stage with noise into the output stage passed through a nonlinear element.

16. The apparatus of claim 9, further including a pulse wave modulator (PWM) between the delta sigma modulator and the class D output stage, the PWM fed by the delta sigma modulator and driving the class D output stage.

17. The apparatus of claim 9, further including means for monitoring supply voltage, and wherein the distortion signal is further based upon the power supply voltage.

18. Apparatus for compensating for output distortion in a class D output stage driven by a delta sigma modulator, the apparatus comprising:
    means for modelling distortion within the class D output stage;
    means for generating a distortion signal based upon the model; and
    means for modifying a feedback signal in the delta sigma modulator in real time, responsive to the distortion signal; and
    means for updating the modelling means based upon an output signal of the class D output stage.

19. The apparatus of claim 18, wherein the means for updating measures more than one moment of the output signal of the class D output stage.

20. The apparatus of claim 19, wherein the means for modelling generates two distortion signals, and the means for modifying modifies two feedback signals in the delta sigma modulator in non-trivially different manners.

21. The apparatus of claim 18, wherein the means for updating updates the modelling means once on apparatus power up.

22. The apparatus of claim 18, wherein the means for updating updates the modelling means continuously.

23. The apparatus of claim 18, wherein the means for modelling further comprises:
    means for monitoring two output signals of the class D output stage;
    means for computing distortion in the class D output stage for various signal patterns based on the two monitored output signals; and means for estimating distortion in the class D output stage for a given signal pattern out of the delta sigma modulator.

24. Apparatus for compensating for output distortion in a class D output stage driven by a delta sigma modulator, the apparatus comprising:

means for determining distortion within the class D output stage by measuring two signals in the class D output stage, and measuring signal timing between the two signals, in real time;

means for generating a distortion signal based upon the determined distortion; and means for modifying a feedback signal in the delta sigma modulator in real time, responsive to the distortion signal.

25. The apparatus of claim 24, wherein the means for measuring two signals measures two output voltage signals during dead time.

26. The apparatus of claim 24, wherein the means for measuring two signals measures two output current signals during dead time.

* * * * *